(12) United States Patent
Adam et al.

(10) Patent No.: US 10,689,756 B2
(45) Date of Patent: Jun. 23, 2020

(54) GAS CONTAINER

(71) Applicant: LINDE AKTIENGESELLSCHAFT, Munich (DE)

(72) Inventors: Peter Adam, München (DE); Wilhelm Bayerl, Sauerlach (DE)

(73) Assignee: LINDE AKTIENGESELLSCHAFT, Munich (DE)

( * ) Notice: Subject to any disclaimer, the term of this patent is extended or adjusted under 35 U.S.C. 154(b) by 40 days.

(21) Appl. No.: 15/524,405

(22) PCT Filed: Nov. 4, 2015

(86) PCT No.: PCT/EP2015/075726
§ 371 (c)(1),
(2) Date: May 4, 2017

(87) PCT Pub. No.: WO2016/071406
PCT Pub. Date: May 12, 2016

(65) Prior Publication Data
US 2018/0282867 A1 Oct. 4, 2018

(30) Foreign Application Priority Data
Nov. 5, 2014 (DE) .......... 10 2014 016 410

(51) Int. Cl.
C23C 16/455 (2006.01)
F17C 13/00 (2006.01)
C23C 16/04 (2006.01)
C23C 16/40 (2006.01)
C23C 8/02 (2006.01)

(52) U.S. Cl.
CPC .......... *C23C 16/45555* (2013.01); *C23C 8/02* (2013.01); *C23C 16/045* (2013.01); *C23C 16/403* (2013.01); *C23C 16/405* (2013.01); *C23C 16/45529* (2013.01); *F17C 13/005* (2013.01); *F17C 2201/0109* (2013.01); *F17C 2201/0119* (2013.01); *F17C 2201/056* (2013.01); *F17C 2201/058* (2013.01); *F17C 2203/0607* (2013.01); *F17C 2203/0617* (2013.01); *F17C 2203/0648* (2013.01); *F17C 2203/0675* (2013.01); *F17C 2209/232* (2013.01); *F17C 2221/05* (2013.01); *F17C 2223/0123* (2013.01); *F17C 2223/036* (2013.01)

(58) Field of Classification Search
CPC ...... F17C 2203/0607; F17C 2203/0604; F17C 2260/053; F17C 1/10
See application file for complete search history.

(56) References Cited

U.S. PATENT DOCUMENTS

| 3,804,059 | A | | 4/1974 | Streel | |
|---|---|---|---|---|---|
| 4,966,207 | A | * | 10/1990 | Howard | ................. B65D 85/84 141/18 |
| 6,290,088 | B1 | | 9/2001 | Zdunek et al. | |
| 6,416,577 | B1 | | 7/2002 | Suntoloa et al. | |
| 7,718,239 | B2 | * | 5/2010 | Klassen | ................... F17C 1/16 206/0.7 |

(Continued)

*Primary Examiner* — Shawn M Braden
(74) *Attorney, Agent, or Firm* — Millen White Zelano & Branigan, PC; Brion P. Heaney

(57) ABSTRACT

A gas container having coating on the inner side that is applied directly onto a base material (110) of the gas container. The coating has a plurality of layers of at least one coating material that may be produced by an ALD method.

9 Claims, 1 Drawing Sheet

(56) References Cited

U.S. PATENT DOCUMENTS

| | | | |
|---|---|---|---|
| 9,822,928 B2* | 11/2017 | Thunhorst | F17C 1/16 |
| 2004/0149759 A1* | 8/2004 | Moser | F17C 1/10 220/581 |
| 2007/0175905 A1 | 8/2007 | Torres et al. | |
| 2009/0140628 A1 | 6/2009 | Kuepper et al. | |

* cited by examiner

GAS CONTAINER

PRIOR ART

Gases are customarily transported in special containers, mostly pressure containers, known as gas bottles. In the context of the transport and the storage of specialty gases, such as those of particularly high purity or calibrating gases, for example, particularly exacting requirements are imposed on the containers. The containers must be produced from materials which ensure compatibility with the gases in question.

This compatibility is substantially influenced here by chemical reactions of the gases with the container material. As a result of such chemical reactions, for example, the concentration of particularly reactive components in a gas mixture may decrease over time, and this may significantly curtail the maximum storage time. In the case of high-purity gases, on the other hand, the purity decreases over time.

In order nevertheless to ensure the concentration of a gas or of the components of a gas mixture over a prolonged time, the container material, for example, may be specially selected and the container may subsequently undergo a specific operation. Suitable materials for the container in that case include, in particular, aluminum or aluminum alloys, and stainless steel, these materials being particularly reaction-resistant. The container then undergoes a particular pretreatment entailing heating, evacuating and rinsing, in order to remove water and other contaminants. This is followed by passivation of the inner walls of the container—that is, a protective layer is formed thereon with the gas to be filled, by means of adhering gas atoms or gas molecules. Lastly, a further evacuation is carried out, and the container can be filled with the gas to be filled.

A comparable operation may also be carried out in order to maintain the purity of gases. In some cases an additional step, namely rinsing of the cylinder with an acid, may also be necessary.

A disadvantage of the above-described operation, which is customarily used, however, is that it is particularly inconvenient and expensive. Moreover, in the event of renewed filling, particularly filling with a different gas, the operation must be carried out again.

Apart from this, the operation must be adapted specifically to the gas to be filled. In the case of gas mixtures in particular, however, it is not possible, or at least not always possible, to select the appropriate gas for the passivation. Moreover, it may be the case that one container material is not equally suitable for all components of a gas mixture.

Known from EP 2 628 817 A1, for example, is a method for applying a protective layer by means of an ALD (Atomic Layer Deposition) process to a piece of steel already coated by means of a PVD (Physical Vapor Deposition) or CVD (Chemical Vapor Deposition) process.

WO 2014/033359 A1 discloses, for example, a method involving the application of a protective layer in the inside of the pump by means of an ALD process.

The problem addressed is therefore that of providing a container which is intended for filling with gas, more particularly with high-purity gas and/or with reactive gas mixtures, which is inexpensive to produce and in particular is diversely usable.

This problem is solved by means of a gas container having the features described herein. Advantageous embodiments are also part of the following description.

DISCLOSURE OF THE INVENTION

This problem is solved by means of a gas container having the features of the independent claims. Advantageous embodiments are subjects of the dependent claims and also of the following description.

Advantages of the Invention

A gas container of the invention such as, for example, a gas bottle or a Constant Pressure (Piston) Cylinder has on its inside a coating applied directly on a base material of the gas container. This coating comprises a plurality of monomolecular layers of at least one coating material and with molecules situated alongside one another in each case substantially directly in the respective layer.

This coating corresponds here to a coating which comprises a plurality of layers, produced by an ALD process, of at least one coating material, since specifically and only by an ALD process, i.e., a process for Atomic Layer Deposition, is it possible to produce monomolecular layers of coating material, with the individual molecules of a layer lying substantially directly alongside one another. In particular, each layer in this case is produced individually by means of an ALD process.

The ALD process for producing such layers is known per se, and the text below will therefore address the key principle only briefly. First of all, a first reactant is brought into contact with a surface of a material to be coated, and a monomolecular layer of the first reactant is formed on the surface. Through a rinsing operation, the excess reactant not bound on the surface is removed. Thereafter a second reactant is brought into contact with the first reactant bound on the surface. In this case the molecules of the first reactant bound on the surface react with molecules of the second reactant to form molecules of the desired coating material. The excess second reactant is removed likewise by means of a rinsing operation. The result is a monomolecular, dense and homogeneous layer of the desired coating material on the surface of the material to be coated. The stated processes may be repeated until a desired thickness of the surface coating is attained.

For the sake of completeness it may be mentioned that the name of the coating process ALD, in other words atomic layer deposition, does suggest a coating with individual atoms. It is well-known, however, that the coating usually comprises molecules, and the name is therefore understandable to a person skilled in the art.

If, then, a gas container having such a coating or a coating produced in this way on its inside is filled with high-purity gas or with a reactive gas mixture, this dense and uniform coating prevents chemical reactions of the gas with the base material of the gas container. In this context it has been recognized that the coating of the invention or the coating material is not connected with the gas to be filled. In particular, therefore, a gas container of the invention can be used for different gases.

The at least one coating material is preferably selected from $Al_2O_3$, $SiO_2$, $TiO_2$, $Ta_2O_5$ and $HfO_2$. These coating materials on the one hand are relatively simple to produce by means of an ALD process, and on the other hand afford particularly effective protection against chemical reactions of fill gases with the base material of the gas container.

Advantageously, at least two of the plurality of layers are formed of different coating materials. Through different coating materials it is possible, for example, to increase corrosion resistance, since different sizes of molecule in different layers of the coating reduce an area of attack for a gas introduced into the gas container.

It is particularly advantageous if the plurality of layers are formed alternately of two different coating materials, more particularly of $Al_2O_3$ and $TiO_2$. This raises the effect of different materials, particularly the corrosion resistance and the smoothing of the surface.

It is of advantage if the coating carries an additional applied coating which comprises molecules of the gas intended for filling. In this case there may be what is called passivation, achieving an additional protective effect. This is particularly suitable in the case of filling with pure gases.

The coating preferably has a thickness of not more than 500 nm, more particularly of not more than 100 nm. The effect of this is first an extremely rapid production and secondly a certain flexibility on the part of the coating. A minimum thickness, conversely, is dependent on the roughness of the base material. "Sharp edges" of the base material must be completely covered in this case.

It is an advantage if the base material of the gas container comprises steel, more particularly chromium-molybdenum steel, more particularly still 34CrMo4 steel. Steel is indeed an inexpensive material, but per se is poorly suited to the pure gases or reactive gas mixtures mentioned at the outset, since in that case reactions that can lead to the contamination of the fill gas occur particularly easily. As a result of the coating of the invention, however, it is now possible to use even steel as a base material for the gas container, since the unwanted reactions are prevented. 34CrMo4 steel, for example, is a steel which is customarily used for gas bottles (but in that case not for filling with pure gases or active gas mixtures) and is therefore readily available and inexpensive.

The gas container is preferably substantially cylindrical or bottle-shaped. This is a commonly used form of gas containers for filling with gas, since it makes the gas container particularly stable and easily transportable.

The gas container is designed advantageously as a gas pressure container, more particularly a high-pressure container. This allows particularly effective filling of the gas container with gas, and hence also a reduction in the size of the gas container.

Further advantages and embodiments of the invention are apparent from the description and the appended drawing.

It is understood that the features stated above and those still to be elucidated hereinafter may be used not only in the particular combination specified but also in other combinations as well, or on their own, without departing from the scope of the present invention.

The invention is shown schematically with the aid of an exemplary embodiment in the drawing, and is described comprehensively below with reference to the drawing.

EMBODIMENT OF THE INVENTION

Figure 1:
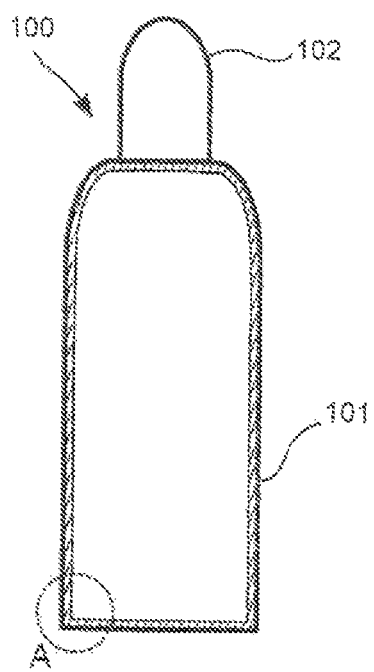
FIG. 1 shows schematically a gas container of the invention.

Shown schematically in FIG. 1 is a gas container 100 of the invention in the form of a gas bottle. The gas bottle 100 presently comprises a base body 101 which is substantially cylindrical in form, and also a closure cap 102. The detail, identified by A, of the left-hand lower corner of the wall of the gas container 100 is shown in more detail in FIG. 2.

Figure 2:
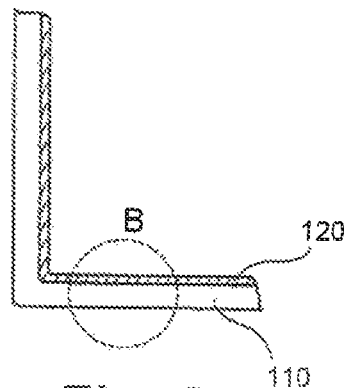
FIG. 2 shows a detail of a wall of a gas container of the invention with a coating in one preferred embodiment.

In FIG. 2, the detail A of the wall of the gas container 100 from FIG. 1 is shown larger. The wall comprises a base material 110, which comprises steel, preferably a 34CrMo4 steel customarily used for gas bottles. The thickness of the base material 110 in this case is several millimeters (about 4 mm to 8 mm), and accordingly is no different from a conventional gas bottle made of steel. Now, however, a coating 120 is applied directly on the base material 110.

As already described at the outset, the coating 120 comprises a plurality of layers, produced by means of an ALD process, of at least one coating material such as $Al_2O_3$ or $TiO_2$, for example. A further detail of the container wall, particularly of the coating 120, is shown in FIG. 3, which comprises the detail identified by B.

Figure 3:
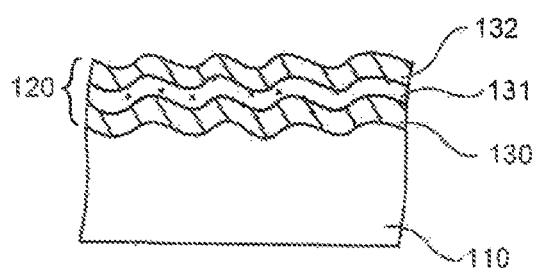
FIG. 3 shows a detail of a wall of a gas container of the invention with a coating in another preferred embodiment.

In FIG. 3, the detail B of the wall of the gas container from FIG. 2 is shown larger and in more detail. It can be seen that the coating 120 applied to the base material 110 consists of a plurality of layers. As an example, only three layers 130, 131, and 132 are shown. Depending on the desired embodiment, however, the coating comprises, for example, up to 50 or 100 layers.

Each individual layer has the thickness of the diameter of one molecule of the respective coating material, which is situated within the range of a few nanometers. Furthermore, the molecules of one layer are homogeneous and disposed very closely to one another, this being an effect of the ALD process.

It is evident in particular in FIG. 3 that the individual layers are adapted to the surface structure of the base material 110. Overall, therefore, the coating 120 forms a highly corrosion-resistant protective layer, thus making the gas container 100 of the invention very suitable for filling with highly reactive gases or gas mixtures.

It is further evident from FIG. 3 that the coating 120 consists of layers of different coating materials. The layers 130 and 132 presently consist of a first coating material, preferably $Al_2O_3$, and the layer 131 in between them consists of a second coating material, preferably $TiO_2$. In the case of a larger number of layers, this arrangement may be continued accordingly, so that the two coating materials alternate with each layer. This increases the protective effect, i.e., the corrosion resistance, of the coating 120.

For the sake of completeness, however, it should be noted that a coating of just one coating material already achieves a distinct protective effect. Alternatively, other combinations, such as more than two different coating materials and/or a different arrangement of the layers, for example, are also possible. For example, there may be two or three layers of a coating material applied one above another as well, before one or more layers of a different coating material follow.

It should also be mentioned that there may also be additional passivation of the coating 120 with a gas to be filled, thereby further increasing the protective effect. This is sensible and advantageous especially when filling with pure gases. In the case of filling with less reactive gases or gas mixtures (e.g., CO, NO, $SO_2$), however, this passivation may also be omitted.

The invention claimed is:

1. A gas container comprising:
   a container made of a base material having an inside coating applied directly on the base material of the container,
   wherein said coating comprises a plurality of monomolecular layers of coating material, wherein said plurality of monomolecular layers are alternately $Al_2O_3$ and $TiO_2$ monomolecular layers, each monomolecular layer having the thickness of one molecule of the respective coating material and in each monomolecular layer the molecules are each situated alongside one another substantially directly in the respective layer, wherein each of the $Al_2O_3$ and $TiO_2$ monomolecular layers is produced by an Atomic Layer Deposition process, and wherein coating has a thickness of not more than 500 nm.

2. The gas container as claimed in claim 1, wherein the coating carries an additional applied coating which comprises molecules of the gas intended for filling.

3. The gas container as claimed in claim 1, wherein base material comprises steel.

4. The gas container as claimed in claim 1, wherein the gas container is substantially cylindrical or bottle-shaped.

5. The gas container as claimed in claim 1, wherein the gas container is a high-pressure container.

6. The gas container as claimed in claim 1, wherein the coating has a thickness of not more than 100 nm.

7. The gas container as claimed in claim 1, wherein the base material comprises chromium-molybdenum steel.

8. The gas container as claimed in claim 1, wherein the base material comprises 34CrMo4 steel.

9. The gas container as claimed in claim 1, wherein said Atomic Layer Deposition process comprises:

bringing a first reactant of a coating material into contact with a surface be coated to form a monomolecular layer of the first reactant on the surface;

removing excess first reactant not bound on the surface by a rinsing operation;

bringing a second reactant of the coating material into contact with the first reactant bound on the surface wherein molecules of the first reactant bound on the surface react with molecules of the second reactant to form molecules of the coating material, and removing excess second reactant by a rinsing operation.

\* \* \* \* \*